(12) United States Patent
Morche

(10) Patent No.: US 7,391,244 B2
(45) Date of Patent: Jun. 24, 2008

(54) DELAY-LOCKED LOOP

(75) Inventor: Dominique Morche, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/518,649

(22) PCT Filed: Jun. 18, 2003

(86) PCT No.: PCT/FR03/01858

§ 371 (c)(1), (2), (4) Date: Dec. 15, 2004

(87) PCT Pub. No.: WO04/001973

PCT Pub. Date: Dec. 31, 2003

(65) Prior Publication Data

US 2005/0206417 A1    Sep. 22, 2005

(30) Foreign Application Priority Data

Jun. 19, 2002    (FR) .................................. 02 07560

(51) Int. Cl.
*H03L 7/06* (2006.01)
(52) U.S. Cl. ........................ 327/158; 327/156; 327/149
(58) Field of Classification Search ......... 327/147–148, 327/156–158
See application file for complete search history.

(56) References Cited

U.S. PATENT DOCUMENTS

| 5,889,436 | A | 3/1999 | Yeung et al. |
| 6,147,525 | A | 11/2000 | Kitagawa et al. |
| 6,154,073 | A | 11/2000 | Choi |
| 6,526,374 | B1* | 2/2003 | Martin .......................... 703/14 |
| 6,798,257 | B1* | 9/2004 | Roe ............................ 327/147 |
| 6,847,241 | B1* | 1/2005 | Nguyen et al. ............... 327/158 |
| 6,943,598 | B2* | 9/2005 | Ghazali et al. ............... 327/147 |
| 6,987,410 | B2* | 1/2006 | Suda et al. .................... 327/165 |
| 2002/0033737 | A1* | 3/2002 | Staszewski et al. ........... 331/17 |

FOREIGN PATENT DOCUMENTS

WO    01 45263 A1    6/2001

OTHER PUBLICATIONS

Weinlader, et al. "Ta 10.3 An Eight Channel 36GSample/S CMDS Timing Analyzer", ISSCC 2000/Session10/Clock Generation and Distribution/Paper TA 10.3, 2000 IEEE International Solid-State Circuits Conference, 0-7803-5853-8/00/$10.00 © 2000 IEEE, p. 170-171.

* cited by examiner

*Primary Examiner*—Dinh T. Le
(74) *Attorney, Agent, or Firm*—Thelen Reid Brown Raysman & Steiner LLP

(57) ABSTRACT

This invention relates to a delay locked loop comprising a line of delay cells (R1, R2, ..., Rn) mounted in series, the delay signal output by the loop being output from the output of one of the delay cells, the input of the delay cells line being connected to a first input of a phase/frequency detector (1), for which a second input is connected to an output from the delay cell.

The loop comprises control means (4) capable of modifying the output from the delay cell connected to the second input of the phase/frequency detector (1), at the rate of a clock signal (H) when stimulated by control information (I).

The invention is particularly applicable to generating and measuring delays and for frequency synthesis in mobile applications.

15 Claims, 6 Drawing Sheets

DELAY-LOCKED LOOP

CROSS-REFERENCE TO RELATED APPLICATION

This application claims priority based on International Patent Application No. PCT/FR2003/001858, entitled "Delay-Locked Loop" by Dominique Morche, which claims priority of French Application No. 02 07560, filed on Jun. 19, 2002, and which was not published in English.

TECHNICAL DOMAIN AND PRIOR ART

The invention relates to a Delay Locked Loop (DLL).

DLL loops are commonly used to put two clock signals into phase alignment, particularly in DRAM (Dynamic Random Access Memory) memories. DLL loops can then give very good synchronism between a clock external to the integrated circuit and an internal clock. DLL loops are also used to precisely generate or measure a time delay, or to generate signal sampling clocks (see "*An Eight Channel 36GSample/s CMOS Timing Analyser*", Dan Weinlader, Ron Ho, Chih-Kong Ken Yang, Mark Horowitz, 2000 IEEE International Solid-Sate Circuits Conference).

The invention is applicable to all domains mentioned above, and particularly advantageously, to generation and measurement of delays in transceivers using the ultra wide band type communication technique.

The schematic diagram for a DLL loop according to prior art is shown in FIG. 1. The DLL loop comprises a delay line composed of n delay cells Ri (i=1, 2, 3, . . . , n-1, n) in series, a phase/frequency detector 1, a charge pump 2 and a loop filter 3. Each delay cell introduces a delay Δt identical to delays in other cells. The delay Δt may be controlled by a signal that may be a voltage or a current. Each delay cell may be made from a differential pair. The delay variation Δt is then obtained by the variation of the polarisation current of the differential pair.

The input and output of the delay line are applied to the phase/frequency detector 1. The phase/frequency detector 1 may be a simple phase comparator that compares phases of input and output signals of the delay line. The signal output from detector 1 controls the charge pump 2 that then generates a current that depends on the phase difference between the input and output signals of the delay line. This current is applied to the input of the loop filter 3 to be filtered. The filtered current output from the loop filter 3 is applied to the cells of the delay line to control the delay of the cells.

The operating method of a DLL loop according to known art will now be described.

A signal with period T is applied to the input of the delay line. When the DLL loop is stable, the input and output signals of the delay line are in phase. The delay between these two signals is then equal to T. Since all delay cells are identical, the delay added by a cell is equal to T/n. In addition to the clock signal applied to the input to the delay line, there are then n clock signals ai (i=1, 2, 3, . . . , n-1, n), a signal ai being offset by the time interval iT/n with respect to the clock signal applied to the input of the delay line. The different signals ai can be used to measure a delay, generate a delay, synthesise a frequency signal, reconstruct signals, etc.

One advantage of this type of structure is its low consumption. However, several disadvantages can be emphasised.

Thus, generating a delay mT/n can lead to the use of a large number n of cells. For example, a delay of 13T/100 (m=13 and n=100) will require the use of a hundred delay cells.

Furthermore, the structure is limited in frequency by the minimum delay Tmin imposed by each elementary delay cell. When working at maximum frequency, it is impossible to generate a delay that is not an integer multiple of Tmin.

The invention does not have these disadvantages.

PRESENTATION OF THE INVENTION

The invention relates to a delay locked loop comprising a line of delay cells mounted in series, a delay signal output by the loop being output from the output of one of the delay cells, the input of the delay cells line being connected to a first input of a phase/frequency detector, for which a second input is connected to an output from the delay cell. The delay loop comprises control means capable of modifying the output from the delay cell connected to the second input of the phase/frequency detector, at the rate of a clock signal when stimulated by control information.

The delay locked loop according to the invention can thus be used to modify the number of delay cells seen by the phase/frequency detector. This modification produces an elementary delay of each delay cell different from the elementary delay T/n obtained according to prior art.

As will become clearer in the remainder of the description, the delay of an elementary delay cell may then be a fractional delay. It is thus possible to obtain a fractional DLL loop.

A modification in the number of delay cells seen by the phase/frequency detector may be made at every clock tick of the signal applied to the input of the delay line. This modification may also be made at a lower frequency.

The use of a number of delay cells lower than the total number of delay cells available also has the advantage that it reduces consumption of the DLL loop. Furthermore, the maximum working frequency is increased since this maximum frequency is inversely proportional to the quantity N.Tmin, where N is the number of delay cells used and Tmin is the minimum delay input by an elementary delay cell.

BRIEF DESCRIPTION OF THE FIGURES

Other characteristics and advantages of the invention will become clearer after reading a preferred embodiment of the invention made with reference to the appended figures, wherein.

The same references denote the same elements in all figures.

DETAILED DESCRIPTION OF EMBODIMENTS OF THE INVENTION

Figure 1:
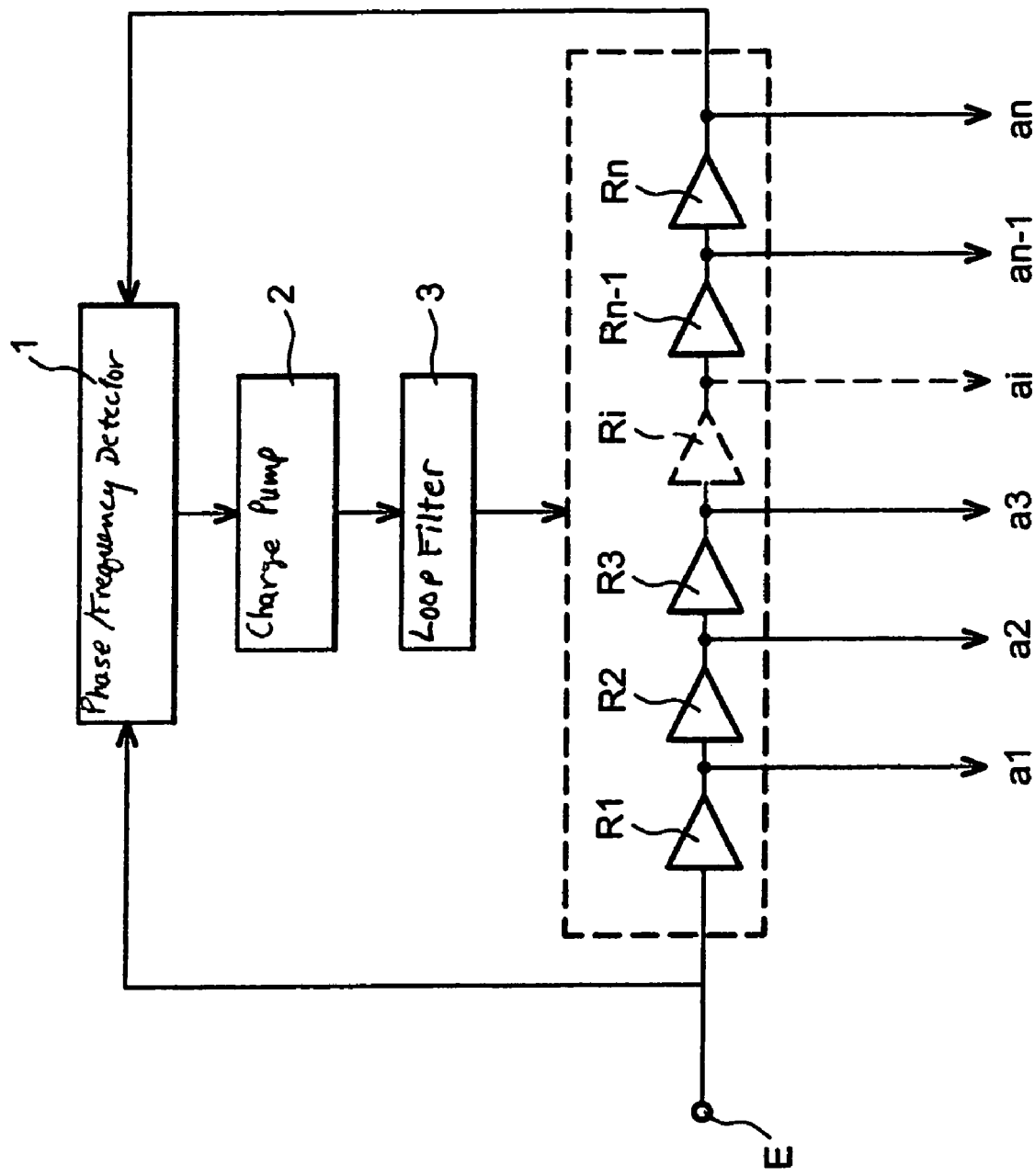
FIG. 1 shows a delay locked loop according to prior art.

FIG. 1 has already been described; therefore there is no point in describing it again.

Figure 2:
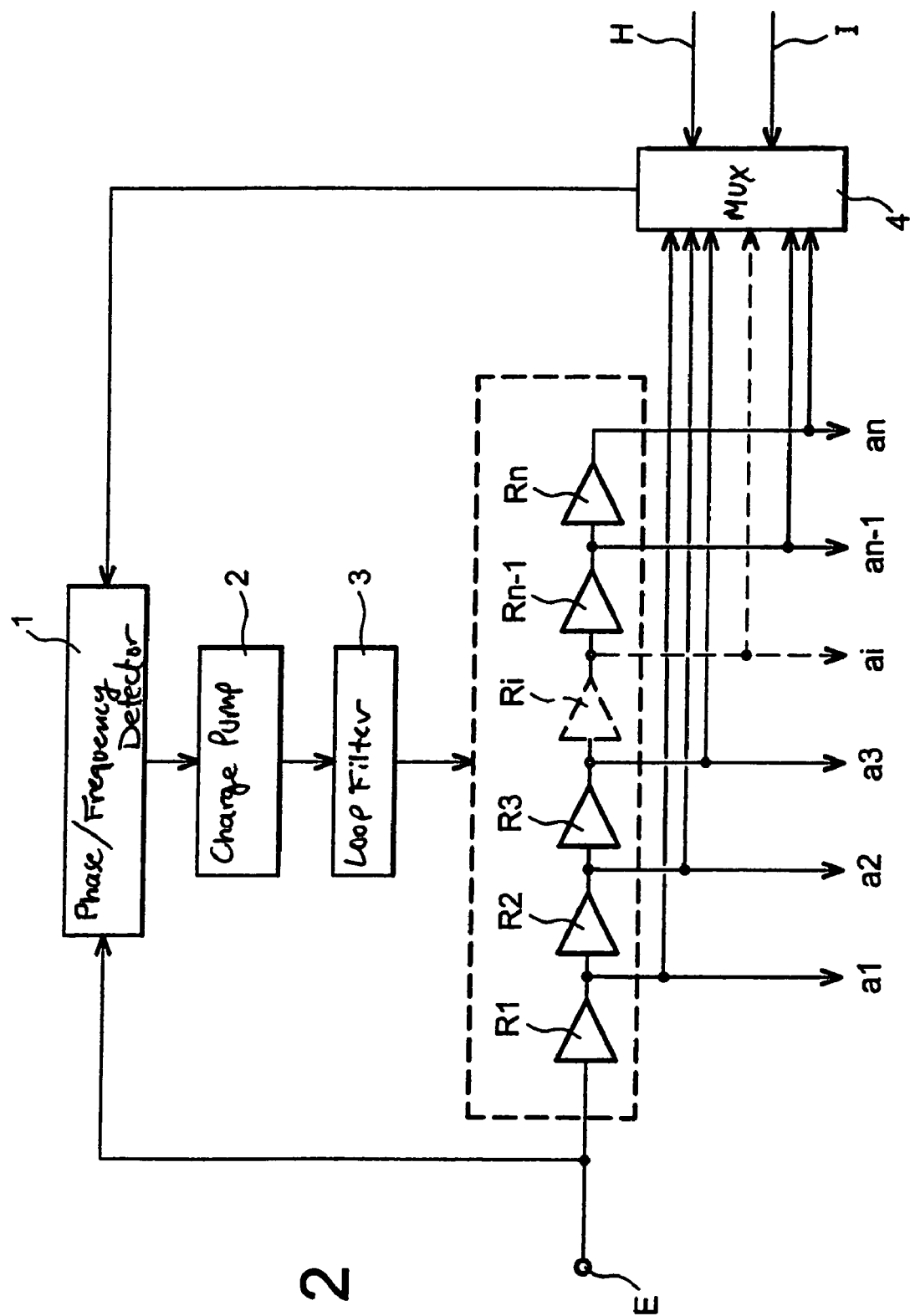
FIG. 2 shows a delay locked loop according to a first embodiment of the invention.

FIG. 2 shows a delay locked loop according to a first embodiment of the invention.

Apart from the elements already mentioned in the description in FIG. 1, a DLL loop according to the first embodiment of the invention comprises multiplexing means 4. The multiplexing means 4 comprise n signal inputs, one signal output, one clock input and one control input.

Each signal input of the multiplexing means 4 is connected to a different delay signal ai (i=1, 2, ..., n). The signal output is connected to one of the inputs of the phase/frequency detector 1. The signal applied to the input of the phase/frequency detector 1 among the signals applied to the input of the multiplexer, is determined by a clock signal H applied to the clock input and by information I applied to the control input. At each tick of the clock signal H, the signal applied to the phase/frequency detector is chosen as a function of the information I. The information I thus selects the sequence of signals that are applied to the input of the phase/frequency detector, at the rate of the clock signal H.

The clock signal H may be the same signal as the clock signal applied to the input of the delay line, or it may be a different clock signal. The information I may be periodic or non-periodic information.

In general, the number of delay cells seen by the phase/frequency detector can change at each clock tick of the clock signal H or at a lower frequency. This modification may be applied such that the average value of the number of delay cells seen by the phase/frequency detector is chosen in advance as a function of the required fractional delay. For example, the average value of the number of delay cells seen by the detector may be obtained by taking a weighted average and using the number of clock ticks of the clock H during which the number of delay cells is effective, as weighting for each delay cell. In this case there is a relation between the average number NC of delay cells used and the delay $\Delta t$ of an elementary cell, namely:

$$\Delta t = T/NC$$

We will now describe a non-limitative example as an illustration of the performances of a DLL loop according to the invention. We will consider a delay line that comprises ten delay cells (n=10). It is assumed that the clock H that controls multiplexing is identical to the clock that is applied to the input of the delay line, except for a delay. The signal applied to the phase/frequency detector is different from the input frequency at each clock tick. In this example, it is also assumed that the signal selected by the information I to be applied to the input of the phase/frequency detector is an alternation of signals a10 and a9. The average phase that is compared by the phase/frequency detector is then equal to 9.5 $\Delta t$, where $\Delta t$ is the delay of one elementary cell. Therefore, we obtain the relation:

$$\Delta t = 2T/19$$

It is then possible to generate delays equal to 2T/19, 4T/19, ..., 18T/19 with a line of ten delays. Nineteen delays would be necessary to obtain the same result using a DLL loop according to prior art.

We will now describe more generally how to generate any delay starting from a simple fractional DLL loop. A simple fractional DLL loop means a DLL loop that only uses two successive delay signals, for example signals an-1 and an, for multiplexing.

It is assumed that signals an-1 and an are used during p clock ticks and q-p clock ticks respectively. The average value of the delay added by the delay line is then equal to (n-p/q)$\Delta t$. The value of the delay of an elementary cell is then given by the relation:

$$\Delta t = q T/(qn-p)$$

Therefore as a non-limitative example, for a delay line comprising ten delay cells and assuming that I is a periodic signal with period 100T (q=100 and the average value of a delay is then obtained on 100 points), the result is then:

$$\Delta t = 100T/(1000-p)$$

An evaluation of the number p then gives:

$$P = PART[1000 - 100T/\Delta t]$$

where PART[X] represents the integer part of X.

To make a fractional delay equal to aT/b at the output from the rank k delay cell, in which a and b are two arbitrary integer numbers, we need to set:

$$k\Delta t = a T/b, \text{ namely}$$

$$a T/b = k q T/(q n-p)$$

Therefore, the result is a system of 2 equations with 4 unknowns p, q, n and k, each unknown being an integer number. There are always solutions to a system of equations like this.

For example, to obtain a delay equal to 13T/100, the solution is as follows:

p=4, q=13, n=8, k=1

The delay 13T/100 is then obtained with only eight delay cells. This result should be compared with the result obtained according to prior art in which 100 delay cells are necessary (see above).

Another example could be given for obtaining a delay of 14T/121. The following solution is then obtained:

p=5, q=7, n=18, k=2

In this example, the number of cells could be even further reduced by the following solution:

p=5, q=14, n=9, k=1

In this case nine cells are advantageously sufficient.

An example of the DLL loop according to the first embodiment of the invention will now be described with reference to FIG. 3.

Figure 3:
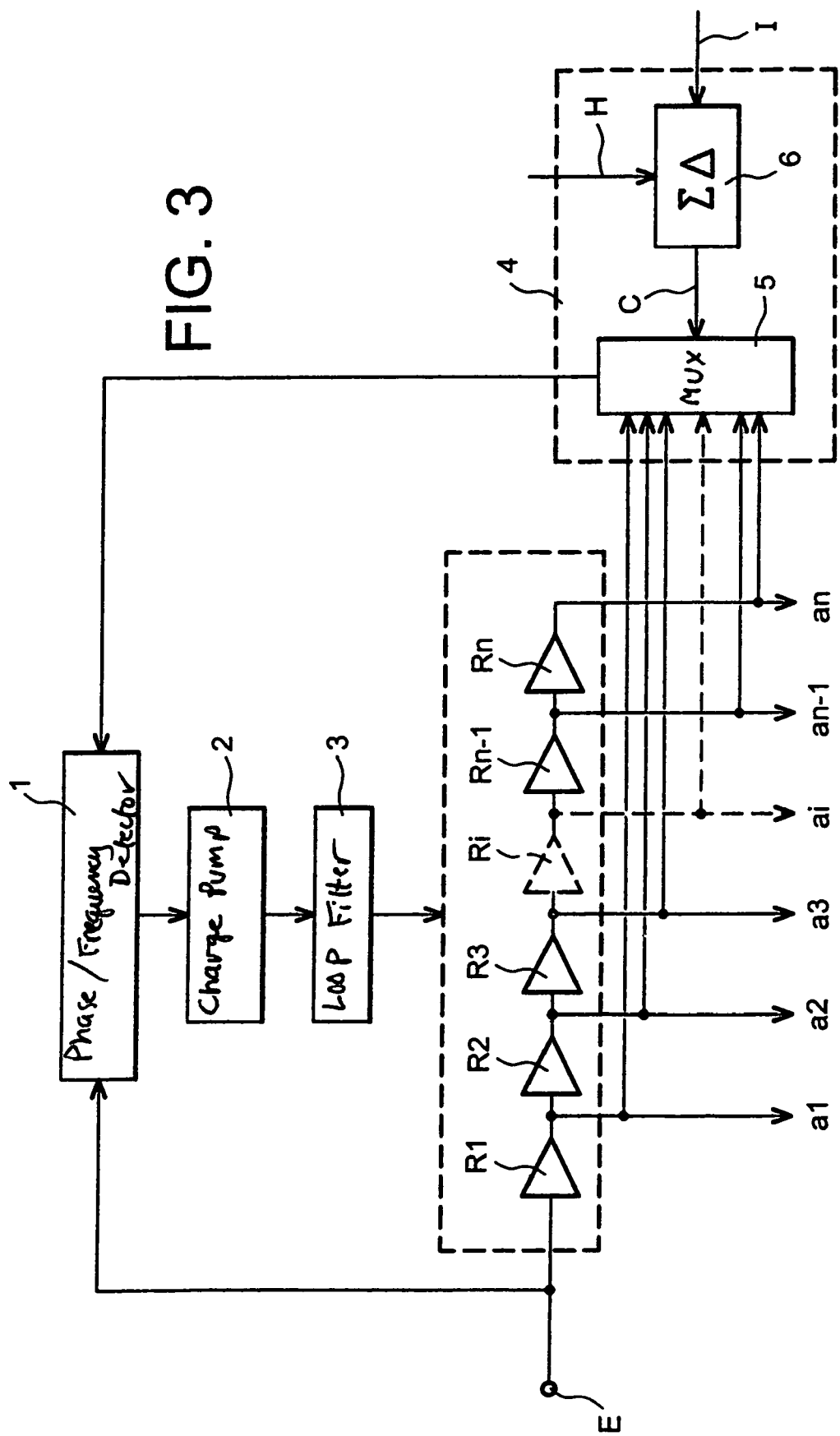
FIG. 3 shows an example of a delay locked loop according to the first embodiment of the invention.

According to the example in FIG. 3, the multiplexing means 4 comprise a multiplexer 5 and a sigma delta modulator 6. The sigma delta modulator 6 comprises a clock input and a signal input. The clock signal H is applied to the clock input and the information I is applied to the signal input. The sigma delta modulator 6 converts the information I into a digital control signal C, at the rate of the clock signal H. The digital control signal C controls switching of the multiplexer 5. One example of the use of a sigma delta modulator is that it reduces the noise of the switching control information.

For example, in the case of a simple fractional DLL loop, the information I applied to the sigma delta modulator to generate a correct sequence of signals to be applied to the phase/frequency detector, is equal to a fractional value p/q, as mentioned above. The signal C output from the modulator may be in two different states (a+1 state to choose the signal an and a 0 state to choose the signal an-1) such that the average value of signal C is equal to p/q, except for the quantification error (however, this quantification error can be reduced by optimising the modulator). It is then possible to obtain an average loop delay equal to the quantity (n-p/q) $\Delta t$, which is the objective.

A DLL loop according to the first embodiment of the invention is obviously not limited to the example of the simple fractional DLL loop mentioned above. More generally, the use of a sigma delta modulator with a multibit quantifier results in a choice between n delay outputs from the DLL loop, where n is a number equal to or greater than 2.

It is also possible according to the invention to apply variable information I to the input of the sigma delta modulator. The result is then a delay or frequency modulated by a variable magnitude contained in the information I. The number NC of delay cells used is then a variable magnitude that modulates the delay $\Delta t$ of an elementary cell. The invention can thus be used to generate a variable delay used to generate a PPM (Pulse Position Modulation) signal used in the UWB (Ultra Wide Band) technology.

Figure 4:
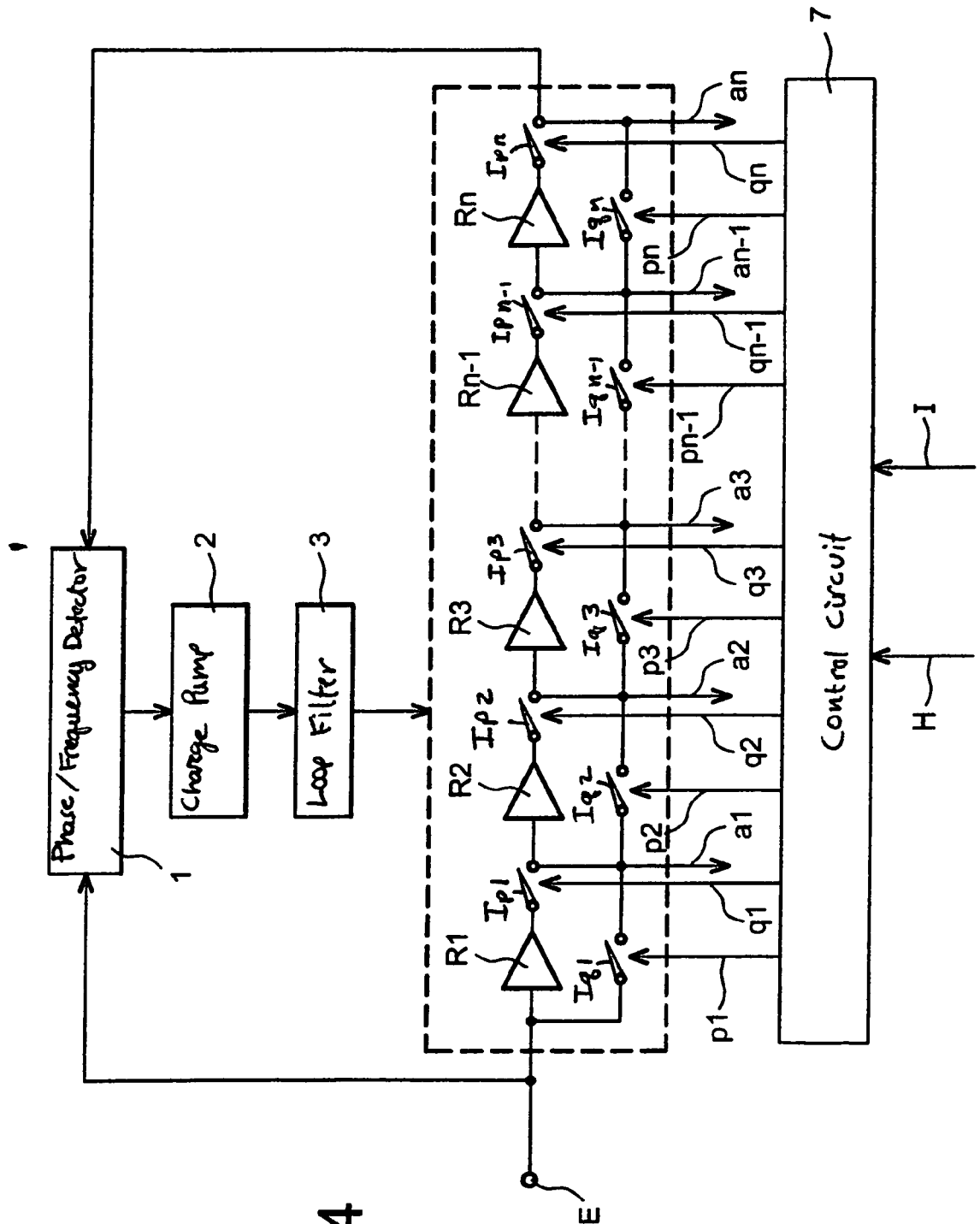
FIG. 4 shows a delay locked loop according to a second embodiment of the invention.

FIG. 4 shows a second embodiment of a delay locked loop according to the invention.

Apart from the circuits shown in FIG. 1, the delay locked loop in FIG. 4 comprises a first set of switches Iqi (i=1, 2, ..., n), a second set of switches Ipi (i=1, 2, ..., n) and a control circuit 7. Each switch Ipi is placed at the output from the delay Ri and each switch Iqi is placed in parallel with the assembly formed by the delay Ri and the switch Ipi.

The switches Ipi and Iqi are controlled by control signals pi and qi respectively. The control circuit 7 comprises a clock input and a control input on which a clock signal H and a control signal I respectively are applied. The signals pi and qi are output from the control circuit 7. At each tick of the clock H, the control circuit 7 outputs a combination of control signals pi, qi capable of opening or closing the corresponding switches Ipi, Iqi. It is then possible to subtract one or several arbitrary delays from the delay loop. If the output from the delay loop has to oscillate, for example between signals an and an-1, it is then possible to alternately short circuit each of the delay cells using an algorithm adapted to this purpose (random algorithm, noise formatting algorithm, etc.). This advantageously reduces the influence of the dispersion in delays between each delay cell. For example, in the case in which the delay of the last delay cell Rn is significantly different from the delay of the other cells, the influence of this cell will be different from the influence of the other cells due to its switching external to the loop.

A delay locked loop according to the second embodiment of the invention has the same advantages as a delay locked loop according to the first embodiment. As a non-limitative example, it is thus possible to make a simple fractional DLL loop using two successive delay signals, for example signals an-1 and an. The value of the delay $\Delta t$ of an elementary cell is then given by the relation:

$$\Delta t = q\, T/(qn-p),$$

where magnitudes p, q, n and T are the previously defined magnitudes.

Similarly, the control circuit 7 may be composed of a sigma delta modulator and a digital control signal (not shown on the figures). The clock signal H and the control signal I are applied on the sigma delta modulator and a digital control signal C output by the sigma delta modulator is applied to the digital control circuit.

According to one improvement to the second embodiment of the invention, switches and switchable loads can be added at the input and output of the different delay cells such that the number of switches passed through is always the same regardless of the programmed delay, and each delay cell always sees the same load on its input and on its output.

Within the context of making a delay locked loop using the silicon technology, and regardless of the embodiment of the invention, the precision of the generated delay or the synthesised frequency depends on the matching that exists between the different delay cells. The number of delay cells in a locked loop according to the invention is significantly lower than the number of delay cells in a locked loop according to prior art, therefore the propagation time constraint for an elementary delay cell can be reduced. It is then possible to increase the surface area of components used to make an elementary delay cell, which advantageously increases the precision of the loop.

Similarly, regardless of its embodiment, a delay locked loop according to the invention can advantageously be used to generate delays that are not integer multiples of the minimum time Tmin, while working at the maximum working frequency.

In general, the large number of degrees of freedom in a DLL loop according to the invention compared with the number of degrees of freedom in a DLL loop according to prior art makes it possible to extend and very significantly improve loop performances.

The invention is advantageously made using conventional VLSI silicon integration techniques.

Figure 5A:
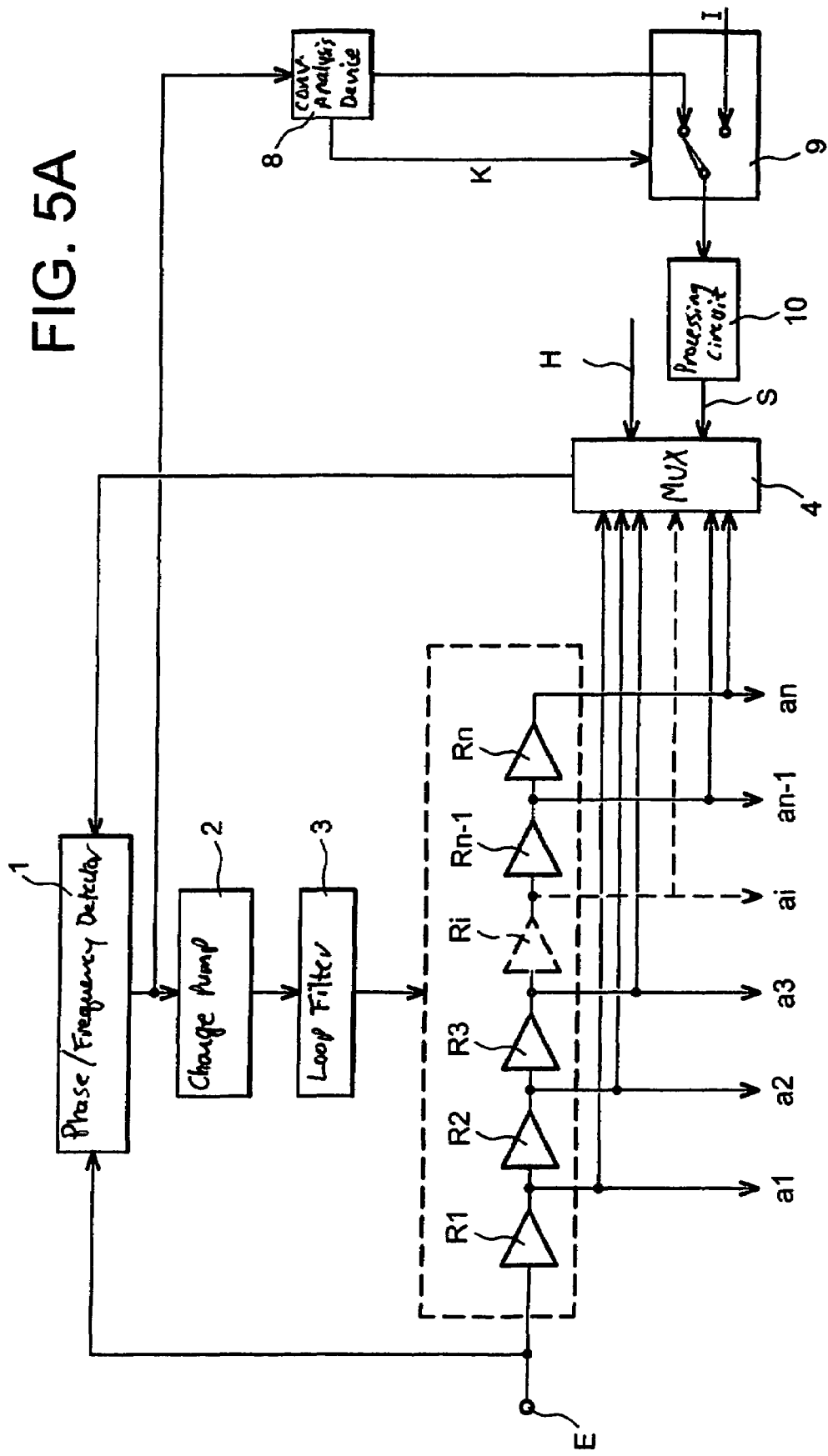
FIGS. 5a and 5b respectively show an improvement to the delay locked loop according to the first embodiment of the invention and an improvement to the delay locked loop according to the second embodiment of the invention.
Figure 5B:
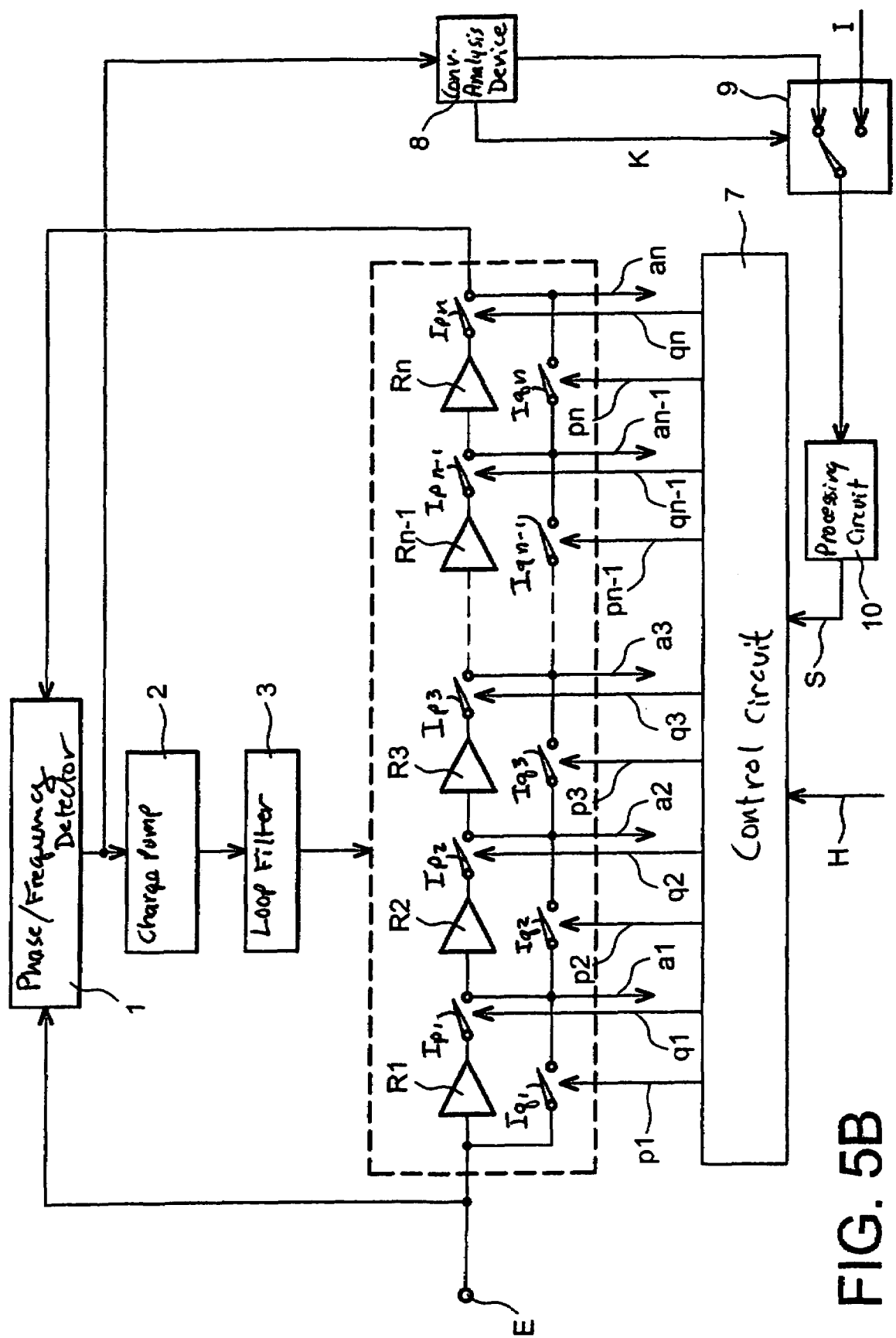

FIGS. 5A and 5B show an improvement to the phase locked loop according to the first embodiment and the second embodiment respectively of the invention.

The operation of a delay locked loop includes two distinct phases: a latching phase and a phase during which the elementary time no longer varies.

The delay generated by each cell in the delay loop has a lower limit and an upper limit. A convergence problem can then arise during the latching phase, particularly when latching constraints are severe. This convergence problem may also arise due to the large dispersion of elementary times of the different cells when the delay locked loop is made using the silicon technology. A delay locked loop can then be in a locked state during the latching phase, when the minimum delay of each cell is reached and the global delay is still too high. The delay locked loop according to the improvement to the invention represented in FIGS. 5A and 5B eliminates this disadvantage.

According to the improvement to the invention, the delay locked loop comprises a convergence analysis device 8, a switch 9 and a processing circuit 10, in addition to the elements described above. The input to the convergence analysis device 8 is connected to the output from the phase/frequency detector 1. The switch 9 comprises two signal inputs, a control input and an output. A first input to the switch signal 9 is connected to the output from the convergence analysis device 8 while the information I mentioned above is applied to the second signal input. The output from switch 9 is connected to the input to the processing circuit 10, the output from which is connected to the control input of the multiplexing means 4 (case in FIG. 5A) or to the control input of the control circuit 7 (case in FIG. 5B).

The convergence analysis device 8 outputs information on its output that measures the stability and convergence state of the loop. The convergence analysis device 8 also outputs the control signal of switch 9.

During the latching phase, the switch 9 is controlled such that the output from the convergence analysis device 8 is connected through the processing circuit 10 to the control input of the multiplexing means 4 (case in FIG. 5A) or to the control input of the control circuit 7 (case in FIG. 5B). The processing circuit 10 uses convergence information output from the device 8 to notify the multiplexing means 4 or the control circuit 7 whether it should increase or reduce the number of cells in the loop. The signal S output from the processing circuit 10 then constitutes a control used to select a number of delay cells that can prevent the loop from getting locked.

When the latching phase is complete, the switch 9 is controlled such that the input of the processing circuit 10 is connected to the information I mentioned above. The information I is then processed by the circuit 10 as a function of the number of delay cells selected during the latching phase. Therefore, the processing circuit 10 will previously have memorised the number of cells selected to obtain convergence. The signal S applied to the control input of the multiplexing means 4 (case in FIG. 5A) or the control input of the control circuit 7 (case in FIG. 5B) is then obtained starting from information I and the number of memorised cells.

The invention claimed is:

1. A delay locked loop comprising a line of n delay cells (R1, R2, ..., Rn) mounted in series from a delay cell of rank 1 to a delay cell of rank n, n being an integer greater than or equal to 2, each delay cell outputting a delayed signal, the line of delay cells having an input which is an input of the delay cell of rank 1 and which is connected to a first input of a phase/frequency detector, wherein said delay locked loop comprises control means including a sigma delta modulator (6) and having n inputs and an output, each input of the control means being connected to an output of a different delay cell of the line of delay cells and the output of the control means being connected to a second input of said phase/frequency detector, said control means selecting at each clock signal (H), on the basis of a control information (I), one of the delayed signals for applying to said second input of said phase/frequency detector, the number of delay cells seen by the phase/frequency detector being able to change at each tick of the clock signal (H).

2. Delay locked loop according to claim 1, wherein the control means comprise multiplexing means (4) with n inputs and one output.

3. Delay locked loop according to claim 2, wherein the multiplexing means (4) comprise a multiplexer (5) and the sigma delta modulator (6) with a clock input on which said clock signal (H) is applied and a signal input on which said control information (I) is applied, the sigma delta modulator (6) outputting a digital control signal applied to the multiplexer (5).

4. Delay locked loop according to claim 1, wherein the control information (I) is a fractional value p/q such that the output from the delay line is composed of the output from the rank n-1 delay cell for p ticks of the clock signal and the output from the rank n delay cell during q ticks of the clock signal, where p and q are two integer numbers and q is greater than p, and the value of the delay of a delay cell is given by the relation:

$$\Delta t = q\,T/(qn-p),$$

where T is the period of a signal applied to the input of the delay line.

5. Delay locked loop according to claim 1, wherein the clock signal (H) is a same signal as a clock signal applied to the first input of the phase/frequency detector (1), except for a delay.

6. Delay locked loop according to claim 1, wherein the clock signal (H) is a signal with a period less than the period of a signal applied to the first input of the phase/frequency detector (1).

7. Delay locked loop according to claim 1, wherein it comprises means (8, 9, 10) to select a number of delay cells such that the loop will not get locked, during a loop latching phase.

8. Delay locked loop according to claim 7, wherein the means (8, 9, 10) provided to select a number of delay cells to prevent the loop from getting locked, during a loop latching phase, comprise a convergence analysis device (8), a switch (9) and a processing circuit (10), the input to the convergence analysis device (8) being connected to the output from the phase/frequency detector (1), the switch (9) being controlled such that the output from the convergence device (8) is connected to the input to the processing circuit (10), the output from the processing circuit (10) being connected to a control input of the control means (4, 7).

9. Delay locked loop according to claim 7, characterised in that it comprises means (10) of memorising the selected number of delay cells.

10. A delay locked loop comprising a line of n delay cells (R1, R2, . . . , Rn) mounted in series from a delay cell of rank 1 to a delay cell of rank a n being an integer greater than or equal to 2, each delay cell outputting a delayed signal, the line of delay cells having an input which is an input of the delay cell of rank 1 and which is connected to a first input of a phase/frequency detector, wherein said delay locked loop comprises control means having n inputs and an output, each input of the control means being connected to an output of a different delay cell of the line of delay cells and the output of the control means hem connected to a second input of said phase/frequency detector, said control means selecting at each clock signal (H), on the basis of a control information (I), one of the delayed signals for applying to said second input of said phase/frequency detector, the number of delay cells seen by the phase/frequency detector being able to change at each tick of the clock signal (H), wherein the control means comprise a first set of n switches Iqi (i=1, 2, . . . , n), a second set of n switches Ipi (i=1, 2, . . . , n) and a control circuit (7) with a clock input on which said clock signal (H) is applied and a control input on which said control information (I) is applied, the switch Ipi (i=1, 2, . . . , n) being placed at the output from the delay cell of rank I (i=1, 2, . . . , n) and the switch Iqi being placed in parallel with an assembly formed by the delay cell of rank i and the switch Ipi, switches Ipi and Iqi being controlled by control signals pi and qi respectively output from the control circuit (7).

11. Delay locked loop according to claim 10, wherein additional switches and switchable loads are placed at the input and output of the different delay cells (R1, R2, . . . , Rn) such that the total number of switches used in the loop during operation of the loop is always the same, and each delay cell always sees the same load on its input and on its output.

12. Delay locked loop according to claim 10, wherein the control information (I) is a fractional value p/q such that the output from the delay line is composed of the output from the rank n-1 delay cell for p ticks of the clock signal and the output from the rank n delay cell during q ticks of the clock signal, where p and q are two integer numbers and q is greater than p, and the value of the delay of a delay cell is given by the relation:

$$\Delta t = q\,T/(qn-p),$$

where T is the period of a signal applied to the input of the delay line.

13. Delay locked loop according to claim 10, wherein the clock signal (H) is a same signal as a clock signal applied to the first input of the phase/frequency detector (1), except for a delay.

14. Delay locked loop according to claim 10, wherein the clock signal (H) is a signal with a period less than the period of a signal applied to the first input of the phase/frequency detector (1).

15. Delay lacked loop according to claim 10, wherein it comprises means (8, 9, 10) to select a number of delay cells such that the loop will not get locked, during a loop latching phase.

* * * * *